United States Patent [19]

de Boer

[11] 4,223,282
[45] Sep. 16, 1980

[54] METHOD OF REDUCING INTERFERENCE COMPONENTS IN A FREQUENCY MODULATED SIGNAL AND DEVICE FOR CARRYING OUT SAID METHOD

[75] Inventor: Eeltje de Boer, Eindhoven, Netherlands

[73] Assignee: U.S. Philips Corporation, New York, N.Y.

[21] Appl. No.: 922,971

[22] Filed: Jul. 10, 1978

[30] Foreign Application Priority Data

May 16, 1978 [NL] Netherlands .................... 7805232

[51] Int. Cl.$^2$ .................... H03C 3/08; H04B 1/12; H04B 15/00
[52] U.S. Cl. .................... 332/10; 375/22; 332/15; 332/18; 455/44; 455/63
[58] Field of Search .................... 332/18, 9 R, 10, 15; 325/65, 437, 473, 475

[56] References Cited

U.S. PATENT DOCUMENTS

| | | | |
|---|---|---|---|
| 3,132,339 | 5/1964 | Boughnou | 325/473 X |
| 3,893,163 | 7/1975 | Wessels et al. | 358/4 |

Primary Examiner—Siegfried H. Grimm
Attorney, Agent, or Firm—Thomas A. Briody; William J. Streeter; Edward W. Goodman

[57] ABSTRACT

A method of reducing interference components in a frequency-modulated carrier signal in which the modulating signal contains a composite color television signal with a chrominance signal modulated on a chrominance subcarrier wave. In addition to the frequency modulation, the carrier signal is pulse-width modulated by the first-order lower side-band component of the frequency-modulated signal produced by the modulated chrominance subcarrier signal.

14 Claims, 5 Drawing Figures

METHOD OF REDUCING INTERFERENCE COMPONENTS IN A FREQUENCY MODULATED SIGNAL AND DEVICE FOR CARRYING OUT SAID METHOD

BACKGROUND OF THE INVENTION

The invention relates to a method of reducing interference components in a frequency modulated signal, comprising a carrier signal being frequency-modulated by at least one modulating signal of a fixed frequency.

The invention is of particular importance for systems in which a video signal is recorded on a record carrier for subsequent read-out. Because of the bandwidth limitation which is generally imposed by the record carrier, a large number of coding systems have been developed in the past, which serve to transform the original video signal in such a way that optimum use is made of this limited bandwidth of the record carrier. A technique which is frequently employed for this purpose is frequency modulation, a carrier signal being frequency modulated by the video signal. A composite color video signal generally contains a chrominance signal which is modulated on a fixed fundamental frequency. For example, an NTSC standard color video signal contains a 3.58 MHz chrominance subcarrier wave, while the PAL and SECAM standard color video signals contain a 4.43 MHz chrominance subcarrier wave.

When such a composite color video signal is frequency modulated on a carrier signal, this modulating signal having the chrominance subcarrier frequency gives rise to side-band components which have a frequency distance to the carrier signal which is equal to an integral multiple of this chrominance subcarrier frequency.

Especially in systems where a comparatively low frequency has been selected for the carrier signal, said side-band components may give rise to considerable interference. In particular, if the second-order lower side-band component extends into the negative frequency range and consequently manifests itself as a so-called "folded-back" sideband component in the positive frequency range, this may give rise to a serious interference effect in the reproduced picture, also referred to as moiré effect.

In order to suppress this undesired interference as a result of said second-order lower side-band component, Netherlands patent application No. 7701035 proposes a method of the type mentioned in the preamble, in accordance with which, prior to the frequency modulation, a correction signal is generated which after frequency modulation is to provide compensation for said second-order lower side-band component. This correction signal is obtained by generating the second harmonic frequency of the chrominance subcarrier signal with the aid of a squaring device. Prior to the frequency modulation, said correction signal is added to the color video signal, while in order to obtain the desired compensation for the undesired lower side-band component, both the phase-relationship and the amplitude relationship of this correction signal with the color video signal should be defined very accurately. Moreover, for effectively suppressing said interference component, the amplitude of the correction signal should vary as a square function of the amplitude of the modulating signal. Furthermore, the required gain depends on the modulation index of the frequency modulation. In order to meet said requirements, complex circuits are needed which should moreover comply with stringent standards.

SUMMARY OF THE INVENTION

It is the object of the invention to provide a method of the type mentioned in the preamble which can be realized with comparatively simple circuitry. For this the invention is characterized in that the carrier signal is pulse-width modulated by the first-order lower side-band component which is contained in the frequency-modulated signal as a result of the modulating signal.

The invention is based on the recognition that, in the case of pulse-width modulation of the carrier signal by said first-order lower side-band component of the frequency-modulated signal, a modulation component is produced at a frequency which is equal to the frequency of the second-order lower side-band component produced during frequency modulation of the carrier signal by the modulating signal. However, the polarity of this modulation component of the pulse-width modulation, is the very opposite of that of the second-order lower side-band component of the frequency modulated signal, so that a reduction of the interference component occurring at this frequency is obtained. Since it is this second-order lower side-band component of the frequency-modulated signal which is the most annoying interference component, the method in accordance with the invention provides an effective signal upgrading. In accordance with a preferred variant of the inventive method, the modulation index for the pulse-width modulation is selected in such a way that this second-order lower side-band component produced during this pulse-width modulation is of at least substantially the same magnitude as the second-order lower side-band component of the frequency-modulated signal, caused by the modulating signal.

Pulse-width modulation of the carrier signal can be effected in different manners. As an example the rising and falling edges of this carrier signal can be separated and the time interval between consecutive edges can be varied with a delay time which is controlled by the first-order lower side-band component. In accordance with a preferred variant, this pulse-width modulation is obtained starting from, at least in approximation, a single side-band frequency-modulated signal with finitely steep edges and by symmetrically limiting this signal. As the frequency-modulated signal contains the carrier wave signal and the said first-order side-band components as the most dominant signal components, this limitation automatically yields the desired pulse-width modulation.

For an effective suppression of the most annoying interference component, the second-order lower side-band component, a further preferred variant of the inventive method is characterized in that the carrier signal contained in the frequency-modulated signal is selectively attenuated prior to the limitation. A further preferred variant is characterized in that the first-order lower side-band component contained in the frequency-modulated signal is selectively amplified prior to the limitation. In accordance with these preferred variants of the inventive method, the amplitude of the first-order lower side-band component is increased relative to the amplitude of the carrier signal, so that the amplitude of the modulation component of the pulse-width modulated signal, which component is intended for compensation of the second-order lower side-band component of the frequency-modulated signal, is also increased.

The selective amplification of the first-order lower side-band component can be obtained in a simple manner in accordance with a further variant by separating said component from the frequency-modulated signal, amplifying it with a predetermined factor, and adding it to the frequency-modulated signal.

The invention also relates to a device for carrying out the method which device is characterized in that it is provided with a modulation device for the pulse-width modulation of the carrier signal by the first-order lower side-band component.

Moreover, the invention in particular relates to a device for use in a video recording and/or playback apparatus in which, for the purpose of recording a composite color video signal, comprising a luminance signal and a chrominance signal which is modulated on a chrominance subcarrier wave, is frequency-modulated on a carrier signal and during playback said color video signal is recovered by frequency demodulation, which device is intended to reduce at least one undesired interference component. In accordance with the invention such a device is characterized in that it is provided with a modulation device for the pulse-width modulation of the carrier signal with the first-order lower side-band which is produced in the frequency-modulated signal by the modulated chrominance subcarrier wave.

DESCRIPTION OF THE DRAWINGS

The invention will now be described in more detail with reference to the drawing, in which FIG. 3 represents the frequency spectrum obtained by the use of the method in accordance with the invention, while

DESCRIPTION OF THE PREFERRED EMBODIMENT

Figure 1:
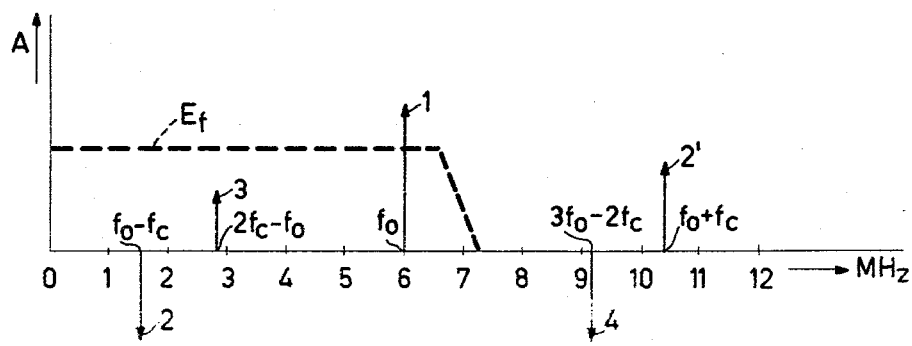
FIG. 1 represents the frequency spectrum of a carrier wave signal which is modulated by a composite color video signal.

FIG. 1 by way of illustration shows the frequency spectrum of a frequency-modulated signal, which is obtained if a carrier signal is frequency-modulated by a standard PAL color television signal. It is assumed that the modulation index has been selected so small that the third-order and higher-order side-band components may be neglected. For the sake of simplicity, the figure furthermore shows a carrier signal 1 with a fixed frequency of $f_o = 6$ MHz. In reality there will be frequency sweep around said frequency $f_o$ as a result of the modulation by the luminance signal contained in the color television signal, for example between 5.5 and 6.5 MHz. However, this is irrelevant for explaining the concept underlying the invention.

As a standard PAL color television signal contains a chrominance subcarrier signal with a frequency $f_c = 4.43$ MHz, which has been modulated with the chrominance information, this modulating signal first of all gives rise to two first-order side-band components in the frequency-modulated signal at a frequency distance $f_c$ to the carrier signal 1, i.e. a frequency component 2 at a frequency $f_o - f_c$ and a frequency component 2' at a frequency $f_o + f_c$. These two first-order side-band components 2 and 2' are of opposite polarity and thus constitute a pure frequency modulation of the carrier signal 1.

Moreover, two second-order side-band components of the carrier signal 1 at a frequency distance of $2f_c$ to the carrier signal 1 are produced during frequency modulation. The second-order upper side-band component is situated at such a high frequency that it may also be neglected. However, the second-order lower side-band component yields a frequency component 3, the so-called folded-back second-order lower side-band component. In this respect the term folded-back refers to the fact that the second-order lower side-band component is situated in the negative frequency range because of the low frequency of the carrier signal 1, and is consequently folded back relative to the frequency 0 in the positive frequency range, resulting in the frequency component 3 at a frequency $2f_c - f_o$.

In the case of a symmetrical squarewave-shaped frequency-modulated signal, the frequency spectrum also contains off harmonics of the carrier signal and side-band components around these harmonics. Most of these frequency components are of no significance because of their magnitude and frequency. For the sake of completeness, FIG. 1 shows the second-order lower side-band component of the third harmonic of the carrier signal. This frequency component 4 is situated at a frequency $3 f_o - 2 f_c$ and thus, like the frequency component 3, has a frequency distance of $2 f_o - 2 f_c$ to the carrier wave signal 1. As the polarities of these two frequency components 3 and 4 are opposite, they together constitute a frequency modulation of the carrier signal 1 and after frequency demodulation give rise to an interference signal with a frequency $2 f_o - 2 f_c$, which manifests itself as a so-called moiré pattern in the reproduced picture.

In order to minimize the bandwidth in a transmission system with frequency modulation, use is generally made of so-termed signal side-band modulation, which means that only the carrier signal and the frequency components below said carrier signal are transmitted. This means that in the frequency spectrum in accordance with FIG. 1 only the frequency components 1, 2 and 3 within the frequency band $E_f$ are of interest. In such a single side-band system, the frequency component 3 is left as an undesired signal, which component after frequency demodulation results in an interference signal of the frequency $2 f_o - 2 f_c$, which gives rise to a moiré pattern. Therefore, it is essential in such transmission systems that said frequency component is suppressed in an optimum manner.

Figure 2:
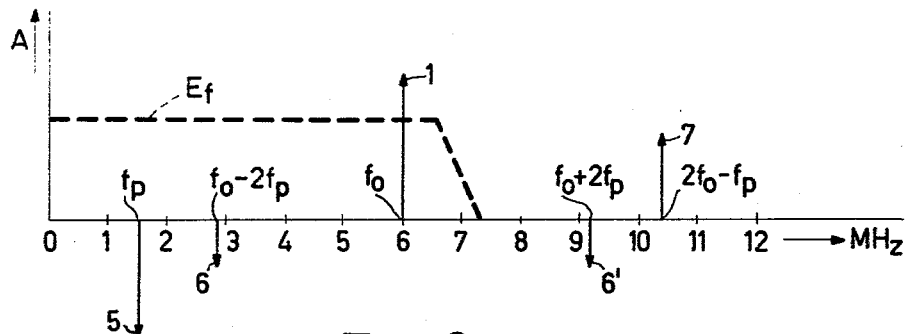
FIG. 2 represents the frequency spectrum of a carrier wave signal which is pulse-width modulated by a modulating signal.

In accordance with the invention this is achieved by subjecting the frequency-modulated signal to a pulse-width modulation, i.e. by pulse-width modulating the carrier signal 1 with the first-order lower side-band component 2. In order to illustrate the effect of this pulse-width modulation, FIG. 2 shows the frequency spectrum of a pulse-width modulated signal which is produced if a carrier signal 1 of a frequency $f_o$ is pulse-width modulated by a modulating signal having a frequency $f_p$. In order to achieve pulse-width modulation, there are several possibilities which will be discussed in more detail hereinafter.

The frequency spectrum of the pulse-width modulated signal, first of all, contains a carrier signal 1 of the frequency $f_o$ as a frequency component. As a second frequency component, it is found that a component 5 of the frequency $f_p$ is produced, i.e. a frequency component which coincides with the modulating signal. Moreover, it is found that the polarity of this frequency component 5, is the same as the polarity of the modulating signal, so that in the frequency spectrum of FIG. 2 the modulating signal may be regarded to correspond to the frequency component 5 with respect to its frequency and polarity.

If symmetrical pulse-width modulation is applied, only even order side-band components are formed around the carrier signal 1, i.e. frequency component at a frequency distance of 2 $nf_p$ (n being an integer) to the carrier signal 1. The principal frequency component are consequently the components 6 at a frequency $f_o-2 f_p$ and the component 6' at a frequency $f_o+2 f_p$. It is found that these components 6 and 6' have a polarity which is opposite to the polarity to the carrier signal 1. Furthermore, only odd side-band components appear around the second harmonic, which itself does not occur in the carrier signal 1, i.e. frequency components at a frequency distance of $(2n+1) f_p$ to the frequency $2 f_o$. For the sake of completeness the frequency spectrum shows the first-order lower side-band component 7 of said second harmonic of the carrier signal 1, which component has a frequency $2 f_o-f_p$. The higher-order side-band components appearing within the specified frequency range may be neglected if the modulation index for the pulse-width modulation is selected to be small. Furthermore, if the transmission bandwidth is limited to a frequency band $E_f$ the frequency components 6' and 7 will no longer play any significant part.

A comparison of the frequency spectra in accordance with FIGS. 1 and 2 reveals that if for the pulse-width modulation the first-order lower side-band component 2 of the frequency-modulated signal is used as a modulating signal, the various frequency components of the pulse-width modulated signal coincide with frequency components of the frequency-modulated signal with respect to their frequencies. Specifically, the frequency component 6 (frequency $f_o-2f_p=2f_c-f_o$) of the pulse-width modulated signal coincides with the undesired frequency component 3 of the frequency modulated signal. Furthermore, the FIGS. 1 and 2 show that these two frequency components 3 and 6 are of opposite polarity.

The recognition of this fact is utilised by the invention in order to reduce the said interference component 3 at the frequency $2 f_c-f_o$ in the frequency-modulated signal. For this purpose the frequency-modulated signal is subjected to a pulse-width modulation, the carrier signal 1 being pulse-width modulated by the frequency component 2. As a result of this, the frequency component 3 is additively combined with the frequency component 6, so that a reduction in magnitude of the resulting frequency component at the relevant frequency $2 f_c-f_o$ is obtained, because the two relevant frequency components 3 and 6 have opposite polarities.

The degree to which said interference component at this frequency $2 f_c-f_o$ is reduced is obviously determined by the ratio of the magnitudes of the two frequency components 3 and 6. However, the magnitude of the frequency component 6 which is produced by the pulse-width modulation may then simply be adapted so as to obtain a maximum reduction of the interference component at the frequency $2 f_c-f_o$. In order to gain an insight into this object, the magnitudes of the various frequency components of the frequency-modulated and the pulse-width modulated signal will be discussed hereinafter.

As is known the magnitudes of the various frequency components in a frequency-modulated signal may be expressed in Bessel functions. If, for the frequency modulation, a small modulation index $\beta$ is used, the following is valid for the amplitudes $A_1$, $A_2$ and $A_3$ of the respective frequency components 1, 2 and 3 of the frequency spectrum of FIG. 1.

$$A_1 = J_0 (\beta) \simeq 1 \qquad (1)$$
$$A_2 = J_1 (\beta)$$
$$A_3 = J_2 (\beta)$$

where $J_0$, $J_1$ and $J_2$ respectively represent the zero, first and second-order Bessel function.

For the pulse-width modulation, a sinusoidal carrier signal 1 is used, on which the frequency component 2 is pulse-width modulated. It is found that, in the case of pulse-width modulation, the amplitudes of the various frequency components are determined by a modulation index m, which is equal to the ratio between the amplitudes of the modulating signal (the frequency component 2) and the carrier signal 1. Thus, this modulation index m may be written as $m=A_2/A_1=J_1 (\beta)$. As the amplitudes of the frequency components of the pulse-width modulated signal can be changed in a simple manner by changing the amplitude ratio of the modulating signal and the carrier signal, the expression $m=C \cdot J_1 (\beta)$, where C is a constant, is used hereinafter for the modulation index.

For the frequency component 6 of the pulse-width modulated signal, which component is of primary importance for the present invention, an amplitude $A_6$ is then found, which complies approximately with the following equation:

$$A_6 = J_2 (m) = J_2 \{C \cdot J_1 (\beta)\} \qquad (2)$$

where $J_2$ is again the second-order Bessel function.

For a complete reduction of the interference component at the frequency $2 f_c-f_o$ the following should be valid:

$$A_3 = A_6 \text{ or } J_2 (\beta) = J_2(m) = J_2 \{C \cdot J_1(\beta)\} \qquad (3)$$

For the first and higher-order Bessel functions, the formula $$J_n (x) = \frac{1}{n!} \left(\frac{x}{2}\right)^n$$

may be given as an approximation. Insertion of this approximation for the Bessel functions in expression (3), then yields the requirement $$\frac{1}{2}\left(\frac{\beta}{2}\right)^2 = \frac{1}{2}\left(\frac{C J_1(\beta)}{2}\right)^2 = \frac{1}{2} \cdot \frac{C^2}{4} \cdot \left(\frac{\beta}{2}\right)^2 \qquad (4)$$

which yields the requirement $$C = 2$$

This requirement (5) thus indicates that for a complete reduction of the interference component at the frequency $2 f_c-f_o$ the amplitude ratio between the frequency component 2 and the carrier signal 1 should be increased by a factor 2. It is obvious that this can be achieved in two different manners, namely by selective attenuation of the carrier signal 1 or by selective amplification of the frequency component 2.

Figure 3:
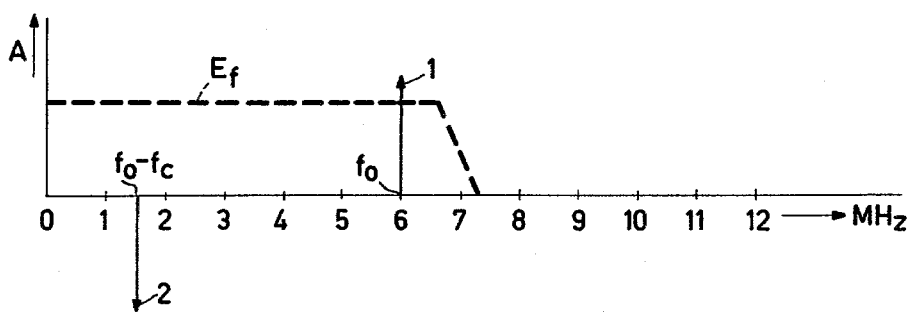

After the pulse-width modulation, the original frequency spectrum of the frequency modulated signal in accordance with FIG. 1 has consequently been transformed into a frequency spectrum in accordance with FIG. 3, which for the sake of simplicity only shows the relevant frequency components within the transmission bandwidth $E_f$. The only frequency components which are left are a carrier signal 1 at the frequency $f_o$ and a frequency component 2 at the frequency $f_o - f_c$. With respect to their locations in the spectrum, these two frequency components 1 and 2 fully correspond to the frequency components 1 and 2 of the original frequency-modulated signal and differ therefrom only with respect to their amplitudes, said change in amplitude being dependent on the manner in which the pulse-width modulation is effected. However, it is obvious that after frequency demodulation in a manner as is customary for a single-side band FM signal, the original color television signal, which is used as the modulating signal for the frequency modulation, is obtained from the signal with a frequency spectrum as shown in FIG. 3.

With respect to the magnitude of the frequency component 2 after pulse-width modulation, the following is to be noted. When the approximative calculation used in the foregoing is adhered to, the amplitude of said component satisfies the formula $$A'_2 = \tfrac{1}{2}m = \tfrac{1}{2}C \cdot A_2 \qquad (6)$$

This means that with the constant $C=2$, the amplitude $A_2'$ of said frequency component 2 after the pulse-width modulation is equal to the amplitude of the original component 2 at the same frequency.

Figure 5:
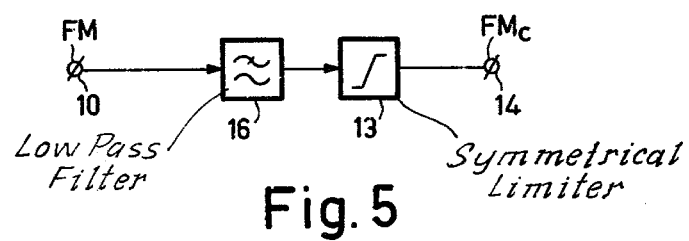

For effecting the pulse-width modulation, several possibilities are known of the literature. In order to indicate a few possibilities, reference is made to U.S. Pat. No. 3,893,163. FIG. 5 of this patent shows a device for effecting a pulse-width modulation, a carrier signal being split into two sub-signals which respectively represent the rising and falling edges of the carrier signal. These two sub-signals are applied in two delay devices with a variable delay time. The delay times of these two delay devices are now varied depending on the modulating signal, but in mutually opposite directions. The output signals of the two delay devices are recombined to a signal of twice the frequency, which then contains the desired pulse-width modulation. When this device is used in the present invention, the first-order lower sideband component 2 may be extracted and applied to the two delay devices as modulation signals for mutually shifting the sub-signals, which have been derived from the remainder of the frequency-modulated signal.

A second possibility, described with reference to FIG. 4 of said U.S. Pat. No. 3,893,163 is based on a carrier signal with finitely steep edges, to which the modulating signal is added. Subsequently, the resulting sum signal is symmetrically limited, so that an at least substantially squarewave signal with the desired pulse-width modulation is obtained. It will be evident that this method of pulse-width modulation can be effected very simply, which is the reason why the embodiment of a device for carrying out the method in accordance with the present invention described hereinafter utilises this method of pulse-width modulation.

Figure 4:
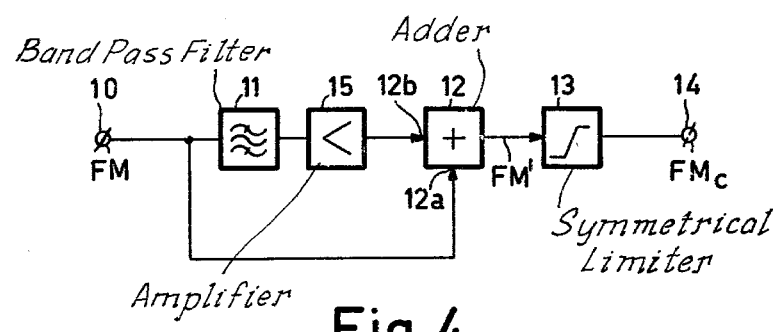
FIGS. 4 and 5 show two embodiments of a device for carrying out this method.

In the device in accordance with FIG. 4, the frequency modulated signal FM with a frequency spectrum in accordance with FIG. 1 is applied to an input terminal 10, while it is assumed that the signal has finitely steep edges. This input terminal 10 is connected to an input 12a of an adder circuit 12, to which said signal FM is thus applied. Moreover, said input terminal 10 is also connected to a band-pass filter 11 with which the first-order lower side-band component 2 (FIG. 1) is extracted. This frequency component 2 is amplified with the aid of an amplifier 15 and subsequently applied to an input 12b of the adder circuit 12. In this adder circuit 12 the two signals applied to its inputs 12a and 12b are added to each other, resulting in a signal FM' whose frequency spectrum fully corresponds to the frequency spectrum of the signal FM with respect to the location of the frequency components. Said signal FM' is then applied to a symmetrical limiter 13, which results in a substantially squarewave-shaped output signal $FM_c$ on the output terminal 14.

This limitation by the limiter 13, as is demonstrated in U.S. Pat. No. 3,893,163, may be regarded as a pulse-width modulation of the frequency component with the higher frequency (the component 1) by the frequency component with the lower frequency (the component 2).

As previously stated, it has been assumed initially that a signal FM with finitely steep edges is used, which is the case if the signal FM is subjected to a frequency limitation. This may be automatically so, if the device in accordance with FIG. 4 is used in a playback apparatus for a record carrier having a transfer characteristic of limited bandwidth. Obviously, it is alternatively possible to limit the band-width of the frequency-modulated signal with the aid of a low-pass filter preceding the device in accordance with FIG. 4, in such way that the signal FM for example only contains the carrier wave 1 and the components of lower frequencies. In this case the signal FM may be regarded as the sum of three sinewave signals 1, 2 and 3. This means that each of the components 2 and 3 gives rise to a pulse-width modulation of the carrier wave 1 as a result of the limitation in the limiter 13. Moreover, pulse-width modulation is effected by the extracted and amplified component 2, which is previously added to the signal FM in the adder circuit 12. For the pulse-width modulation of the carrier wave 1 by the component 3 a modulation index $n = A_3/A_1 \simeq A_3$ is valid. In analogy to formula (6) this means that after the pulse-width modulation the amplitude of the interference component 3 is equal to $$\tfrac{1}{2}n = \tfrac{1}{2}A_3 \qquad (7)$$

For the pulse-width modulation of the carrier wave 1 by the component 2 a modulation index $m = (1+K)A_2$ is valid, which in accordance with formula (2) results in a frequency component 6 in the pulse-width modulated signal, which satisfies the formula $$A_6 = J_2(m) = J_2\{(1+K)A_2\} \qquad (8)$$

Equalising (7) and (8) then yields $K \simeq 0.4$ as requirements for a full compensation of the interference component at the frequency $2f_c - f_o$, while for the amplitude $A_2'$ of the component 2 yields $A_2' = \tfrac{1}{2}m \simeq 0.7 A_2$.

A variant to the possibility given in the foregoing can be obtained by not only extracting the component 2 with the aid of the band-pass filter 11, but both components 2 and 3. This is certainly useful if the two components are situated close to each other with respect to their frequencies. Analogous to the foregoing calculations, the value of the gain K can then be determined at which full compensation of the interference component at the frequency $2f_c - f_o$ is obtained, which results in the requirement $K = 1$.

A third possibility is obtained in case of a frequency modulated signal FM on the input terminal 10 which has not been subjected to any frequency limitation, which may be the case when the device in accordance with FIG. 4 is used in a recording apparatus, although said signal FM has finitely steep edges. This may for example be the case when an FM modulator is used which supplies a triangular output signal. If said signal FM were applied to a symmetrical limiter the zero passages would not be shifted, so that there would not be any pulse-width modulation. This means that in the device in accordance with FIG. 4 the pulse-width modulation is solely caused by the extracted component 3 which is applied to the input 12b of the adder circuit 12. In accordance with formula (5), which has been found by approximation, the amplifier 15 should then have a gain of two. The amplitude of the frequency component 2 after pulse-width modulation will then be twice the amplitude of the original frequency component 2, because this original component 2 is maintained and the component of the same magnitude which is produced at this frequency by the pulse-width modulation is added thereto.

Also in this case it is again possible to extract either the component 2 only or both components 2 and 3 by means of the band-pass filter 11 and to apply them to the input 12b of the adder circuit 12.

FIG. 5 shows a second very simple embodiment of the device for carrying out the method in accordance with the invention, wherein corresponding elements bear the same reference numerals as FIG. 4. The frequency modulated signal FM is applied to the input terminal 10, which is connected to a low-pass filter 16. It is assumed that the frequency-modulated signal FM is limited with respect to its bandwidth, i.e. that the upper side-bands have been suppressed. The low-pass filter 16 has a frequency response with a cut-off frequency between the frequency $f_o$ of the carrier signal 1 and the frequency $2f_c - f_o$ of the frequency component 3 of the frequency-modulated signal. As a result of this, the amplitudes of the frequency components 2 and 3 are changed relative to that of the carrier wave 1 of the frequency-modulated signal. The output signal of this low-pass filter 16 is subsequently applied to the limiter 13, so that the desired pulse-width modulation is obtained. By a suitable choice of the frequency response of the low-pass filter 16, it is again possible to assure that the interference component at the frequency $2f_c - f_o$ is fully eliminated, so that the spectrum of the signal $FM_c$, which is available at the output 14, corresponds to the frequency spectrum shown in FIG. 3. In accordance with the approximative method of calculation given in the foregoing, the requirement is found that the carrier wave amplitude should be attenuated by a factor 2.

The method in accordance with the invention thus enables the most significant interference component in a frequency modulated signal, in particular a signal of low carrier frequency, to be suppressed. In a transmission system in which an information signal is recorded on a record carrier and is subsequently read, the method in accordance with the invention may be used both during recording and during reproduction of the information. Incorporating the device in accordance with FIG. 4 or 5 in the recording apparatus means that ultimately the signal $FM_c$ is recorded on the record carrier. After reading, this signal can be applied directly to a frequency demodulator and then results in the original information signal in which the normally appearing moiré interference has been reduced to high degree. If the device in accordance with FIG. 4 or 5 is incorporated in the read apparatus, the normal frequency-modulator signal FM is recorded on the record carrier. The signal FM which has been read is then first corrected in the indicated manner, which results in the signal $FM_c$ which is subsequently applied to a frequency demodulator. If for frequency demodulation a circuit arrangement is used, which, as first stage, includes a limiter, it will be evident that this limiter can perform the function of the limiter 13 in the device in accordance with FIG. 4 or 5.

It will be evident that for obtaining full compensation of the interference component it is essential to maintain the correct phase relationship between the various signal components. Obviously, this imposes certain requirements on the phase characteristics of the filters which are used. Moreover, in the most ideal case, the amplitude ratio between the components 2 and 3 and the carrier wave 1 should have the desired value for every possible frequency of the modulated carrier signal within the frequency sweep. For the device in accordance with FIG. 5 this would mean that the amplitude response of the low-pass filter 16 should preferably have a flat portion with a frequency-independent value both within the frequency band of the components 2 and 3 and within the frequency sweep of the carrier signal 1. However, it has been found that a suppression of the interference component which suffices in practice can also be obtained with a substantially simpler filter characteristic. For example in the device in accordance with FIG. 5, a filter with a second-order Butterworth-Thomas characteristic is used as the low-pass filter 16, which yielded fully acceptable results with respect to the suppression of the interference component.

What is claimed is:

1. A method of reducing interference components in a frequency-modulated signal, comprising a carrier signal being frequency-modulated by at least one modulating signal of a fixed frequency, wherein the carrier signal is pulse-width modulated by the first-order lower side-band component which is contained in the frequency-modulated signal as a result of the modulating signal.

2. A method as claimed in claim 1, wherein the modulation index for the pulse-width modulation is selected so that the second-order lower side-band component produced during this pulse-width modulation is of, at least substantially, the same magnitude as the second-order lower side-band component of the frequency-modulated signal, caused by the modulating signal.

3. A method as claimed in claim 1 or 2, wherein the pulse-width modulation is obtained, starting from, at least in approximation, a single side-band frequency-modulated signal with finitely steep edges and by symmetrically limiting that signal.

4. A method as claimed in claim 3, wherein the carrier signal contained in the frequency-modulated signal is selectively attenuated prior to the limiting.

5. A method as claimed in claim 3, wherein the first-order lower side-band component contained in the frequency-modulated signal is selectively amplified prior to the limiting.

6. A method as claimed in claim 5, wherein the selective amplification of the first-order lower side-band component is obtained by extracting said component from the frequency-modulated signal, amplifying it by a predetermined factor, and adding it to the frequency-modulated signal.

7. A method as claimed in claim 1 or 2, wherein a symmetrical frequency-modulated signal is used, and which further comprises extracting the first-order lower side-band component from said signal, amplifying said first-order lower side-band component by a predetermined factor, after which pulse-width modulation is obtained by adding said amplified first-order lower side-band component to the frequency modulated signal and symmetrically limiting the sum signal.

8. A device for reducing interference components in a frequency-modulated signal, said signal having a carrier signal which is frequency-modulated by at least one modulating signal at a fixed frequency, wherein the device comprises a modulation device for the pulse-width modulation of the carrier signal by the first order lower side-band component in said frequency-modulated signal.

9. A device as claimed in claim 8, wherein the modulation device comprises a limiting circuit for symmetrically limiting the frequency-modulated signal.

10. A device as claimed in claim 9, wherein the device further comprises a low-pass filter for the suppression of upper side-band components of the frequency-modulated signal, which filter precedes the limiting circuit.

11. A device as claimed in claim 9 or 10, wherein the modulation device further comprises an attenuation circuit for selectively attenuating the carrier signal, which circuit precedes the limiting circuit.

12. A device as claimed in claim 11, wherein the attenuation circuit comprises a low-pass filter having a cut-off frequency which is situated between the frequency of the first-order lower side-band component and that of the carrier signal.

13. A device as claimed in claim 9 or 10, wherein the modulation device further comprises a selective amplifier device for selectively amplifying the first-order lower side-band component, which selective amplifier device precedes the limiting circuit.

14. A device as claimed in claim 13, wherein the modulation device further comprises an adding device, first means for applying the frequency-modulated signal to said adding device, a band-pass filter for extracting the first-order lower side-band component from the frequency-modulated signal, and second means for applying said extracted first-order lower side-band component, amplified by a predetermined factor, to the adding device.

* * * * *